(12) United States Patent
Do et al.

(10) Patent No.: US 10,879,223 B2
(45) Date of Patent: Dec. 29, 2020

(54) DISPLAY INCLUDING NANOSCALE LED MODULE

(71) Applicant: Samsung Display Co., Ltd., Yongin-Si (KR)

(72) Inventors: Young Rag Do, Seoul (KR); Yeon Goog Sung, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 217 days.

(21) Appl. No.: 15/442,421

(22) Filed: Feb. 24, 2017

(65) Prior Publication Data

US 2017/0250168 A1 Aug. 31, 2017

(30) Foreign Application Priority Data

Feb. 26, 2016 (KR) ........................ 10-2016-0023090

(51) Int. Cl.
*H01L 25/16* (2006.01)
*G09G 3/34* (2006.01)
(Continued)

(52) U.S. Cl.
CPC ............. *H01L 25/167* (2013.01); *G09G 3/32* (2013.01); *G09G 3/3426* (2013.01);
(Continued)

(58) Field of Classification Search
CPC ... H01L 25/167; H01L 25/0753; H01L 25/50; H01L 25/38; H01L 33/42; H01L 33/62;
(Continued)

(56) References Cited

U.S. PATENT DOCUMENTS 9,659,982 B2  5/2017 Zhang
2004/0263499 A1* 12/2004 Tanada ..................... G09G 3/30
345/204
(Continued)

FOREIGN PATENT DOCUMENTS

CN  104980669 A  10/2015
JP  5345178 B2  11/2013
(Continued)

*Primary Examiner* — Kent W Chang
*Assistant Examiner* — Sujit Shah
(74) *Attorney, Agent, or Firm* — Lewis Roca Rothgerber Christie LLP

(57) ABSTRACT

Provided is a display including a very-small light-emitting diode (LED) and a method of manufacturing the same. The display includes a panel in which first and second signal lines are disposed in a lattice form, an LED module including an electrode assembly having a first electrode connected to the first signal line, a second electrode connected to a ground, and a plurality of very-small LEDs connected to the first and second electrodes, and two or more switches which connect the first and second electrodes to the first signal line, wherein the second electrode is connected to a common electrode formed on the panel, at least one other LED module is grounded to the common electrode, and the two or more switches selectively provide a current supplied through the first signal line to the first electrode on the basis of a signal of the first and second signal lines.

17 Claims, 6 Drawing Sheets

(51) Int. Cl.
  *H01L 33/62* (2010.01)
  *G09G 3/32* (2016.01)
  *H01L 25/075* (2006.01)
  *H01L 25/00* (2006.01)
  *H01L 33/38* (2010.01)
  *H01L 33/42* (2010.01)
  *G09G 3/3225* (2016.01)

(52) U.S. Cl.
  CPC .......... *H01L 25/0753* (2013.01); *H01L 25/50* (2013.01); *H01L 33/38* (2013.01); *H01L 33/42* (2013.01); *H01L 33/62* (2013.01); *G09G 3/3225* (2013.01); *G09G 3/3413* (2013.01); *G09G 2300/0426* (2013.01); *G09G 2300/0439* (2013.01); *G09G 2300/0823* (2013.01); *G09G 2330/00* (2013.01)

(58) Field of Classification Search
  CPC ........ H01L 33/38; G09G 3/32; G09G 3/3426; G09G 3/3225; G09G 3/3413; G09G 2300/0426; G09G 2300/0439; G09G 2300/0823; G09G 2330/00
  USPC ......................................................... 345/211
  See application file for complete search history.

(56) References Cited

U.S. PATENT DOCUMENTS

| | | | | |
|---|---|---|---|---|
| 2005/0259703 | A1* | 11/2005 | You | G09G 3/3233 372/38.07 |
| 2006/0033423 | A1* | 2/2006 | Nishimura | G09F 13/20 313/501 |
| 2009/0219225 | A1* | 9/2009 | Cope | G09F 9/30 345/55 |
| 2010/0127238 | A1* | 5/2010 | Kim | H01L 33/387 257/13 |
| 2011/0001690 | A1* | 1/2011 | Mori | G09G 3/3655 345/87 |
| 2011/0074749 | A1* | 3/2011 | Higashi | H01L 27/12 345/206 |
| 2011/0089850 | A1* | 4/2011 | Shibata | H05B 45/00 315/250 |
| 2011/0260633 | A1* | 10/2011 | Takeda | H05B 33/0815 315/192 |
| 2012/0018716 | A1* | 1/2012 | Zhao | C08F 20/18 257/40 |
| 2012/0120123 | A1* | 5/2012 | Adachi | H05B 45/37 345/690 |
| 2013/0027623 | A1* | 1/2013 | Negishi | H01L 25/0753 349/42 |
| 2015/0162499 | A1* | 6/2015 | Sato | H01L 33/387 257/99 |
| 2015/0357315 | A1* | 12/2015 | Oraw | H01L 25/0753 315/294 |
| 2016/0005383 | A1* | 1/2016 | Lee | G09G 3/3291 345/690 |
| 2016/0019019 | A1* | 1/2016 | Ikeda | G06F 3/0412 345/173 |

FOREIGN PATENT DOCUMENTS

| | | |
|---|---|---|
| JP | 5583097 B2 | 9/2014 |
| JP | 201505764 A | 3/2015 |
| KR | 2006060461 A | 6/2006 |
| KR | 101436123 B1 | 11/2014 |
| KR | 20160006339 A | 1/2016 |
| KR | 20160010869 A | 1/2016 |
| KR | 20160073742 A | 6/2016 |

* cited by examiner

DISPLAY INCLUDING NANOSCALE LED MODULE

BACKGROUND

1. Field of the Invention

The present invention relates to a display including a nanoscale light-emitting diode (LED), and more particularly, to an LED display including a nanoscale LED and a method of manufacturing the same.

2. Discussion of Related Art

In 1992, Nakamura of Nichia Corp. of Japan succeeded in fusing high-quality single crystal gallium nitride (GaN) semiconductors by applying a low-temperature GaN compound layer, and light-emitting diodes (LEDs) have since been actively developed. An LED is a semiconductor having a structure in which an N-type semiconductor crystal having a plurality of electrons serving as a carrier is combined with a P-type semiconductor crystal having a plurality of electron holes serving as a carrier by utilizing characteristics of compound semiconductors, and is a semiconductor device which converts an electrical signal into light having a wavelength band included in a desired region and emits the converted light. Such LED semiconductors are considered a lighting revolution as an ecofriendly material because the LED semiconductor has very low energy consumption due to high light conversion efficiency, has semi-permanent lifetime, and is environmentally friendly. Recently, high-brightness red, orange, green, blue, and white LEDs have been developed due to the development of compound semiconductor techniques.

Accordingly, LED lighting and LED displays are being developed using LEDs, and among them, an LED display can be utilized as a display of various small electronic devices such as mobile phones, notebooks, and the like, and research on LED displays has been actively progressing.

Currently, a liquid crystal display (LCD) is an example of an LED utilized in a display. Since an LCD does not generate light spontaneously, a backlight which generates light should be provided on a back surface of a communication LCD panel, and white light is illuminated from the back surface of the LCD panel so that a color of an image implemented by the LCD panel can be reproduced close to an actual color. A cold cathode fluorescent lamp (CCFL) or an external electrode fluorescent lamp (EEFL) was initially used as a light source. However, with the emergence of LEDs having high efficiency and excellent physical and chemical properties, backlights using LEDs as a light source have been put into practical use, and furthermore, attempts have been made to commercialize LEDs as full-color LED displays instead of simple backlights.

According to these attempts, specifically, a display for an outdoor electric signboard, which put tens of thousands of three-primary-color LED lamps of red, green, and blue on a very large substrate, is a product that can be seen as a full-color LED display that is currently commercialized in daily life. A home TV that is called an LED TV and a computer monitor are an LCD TV and a monitor that use a white or three-primary-color LED instead of a conventional fluorescent lamp as a backlight of an LCD panel, but are not true LED displays.

A TV or monitor-sized display cannot be developed by using existing LEDs due to fundamental limitations of a technical method of manufacturing a display using LEDs and a method of implementing full color.

When a display for a TV is directly manufactured using the existing LEDs, it is necessary to connect 5 to 40 wafers having a size of 2 to 8 inches in order to manufacture a 40-inch TV. Therefore, there are a number of problems in directly implementing TV-class displays with LEDs using currently known manufacturing techniques that cannot be overcome by the present technology. In addition, since three-primary-color LEDs of red, green, and blue must be embedded in one pixel in order to implement full color, a full-color LED display cannot be implemented by simply serially connecting red, green, and blue LED wafers.

According to many known studies, in order to implement a highly efficient LED display, in a bottom-up method of directly growing a III-V group thin film and a nano-rod LED at positions of patterned pixels of a large-area glass substrate for an actual display, a process of directly depositing a III-V group thin film on a large substrate, such as a substrate of a size of a display for a TV, and a process of growing a highly efficient crystalline III-V group thin film and a nano-rod LED on a transparent electrode patterned on a transparent amorphous glass substrate are also very crystallographically difficult. Because of these technical limitations, there have been hardly any attempts to implement a TV or monitor class full-color display by directly growing an LED on a large area glass substrate.

Another approach that is being studied by many researchers to implement an LED display is a nanotechnology-based bottom-up method. This method is a method of implementing a large area display by growing a nano-rod-type LED on a single crystalline substrate, removing a part of the LED, and rearranging it on an electrode patterned in a pixel in a bottom-up manner. However, as described above, the nano-rod LED manufactured by the bottom-up method has a problem in that light emission efficiency is inferior to that of a conventional thin-film LED grown on a wafer.

As another method, there is a top-down method of implementing an LED display by cutting out a highly efficient LED. Generally, this method is a method of implementing a display in a one-to-one correspondence manner in which micro-LEDs manufactured in a top-down manner at positions of sub-pixels of a large-area glass substrate are arranged one by one. In this case, since an LED is grown on a sapphire substrate and then patterned to be micro-sized, and the micro LED is manufactured and electrodes are then wired, a micro LED display smaller than a wafer substrate is implemented.

As a current technique level, the above-described last method seems preferable in the implementation of an LED display. However, when an electrode, an LED, and another electrode are laminated in a bottom-up manner and then three-dimensionally coupled in an electrode wiring of a manufactured LED, the LED must be coupled to be three-dimensionally erect between two different electrodes. This may be possible using a general LED. When the LED is manufactured to be nanoscale, it is difficult to assemble in three dimensions on the electrode, and some of them may exist in a lying form, and thus defective pixels may occur. Even when a nanoscale LED is three-dimensionally erect on an electrode, there is a problem in that it is difficult to couple two different very-small electrodes to each other in one-to-one correspondence. The occurrence of defects of such a pixel may cause a problem in that an entire display is defective even when one or two pixels are defective, and thus there may be a problem in that it results in a defective display.

DOCUMENT OF RELATED ART

Patent Document (Patent Document 1) Korea Patent Registration No. 2006-0060461

SUMMARY OF THE INVENTION

The present invention is directed to a large-area color bipolar light-emitting diode (LED) or RGB full-color LED display capable of being implemented by disposing LED modules including a plurality of nanoscale LEDs connected to two different electrodes without a short-circuit in a pixel of the display.

According to various embodiments, a display capable of having minimized defects in image quality by operating nanoscale LEDs that have at least some polarities alternately arranged on an LED module on the basis of an alternating current (AC) may be provided.

According to an aspect of the present invention, there is provided a display including a very-small light-emitting diode (LED). The display includes a panel in which a first signal line and a second signal line are disposed in a lattice form, an LED module including an electrode assembly having a first electrode connected to the first signal line and the second signal line and a second electrode connected to a ground, and a plurality of very-small LEDs connected to the first electrode and the second electrode, and two or more switches which connect the first signal line and the second signal line to the first electrode, wherein the second electrode is connected to a common electrode formed on the panel, at least one other LED module is grounded to the common electrode, and the two or more switches selectively provide a current supplied through the first signal line to the first electrode on the basis of a signal of the first signal line and a signal of the second signal line.

At least some polarities of the plurality of very-small LEDs included in the LED module may be connected to the first electrode and the second electrode to be in opposite directions.

In the LED module, a solution including the plurality of very-small LEDs may be introduced into the electrode assembly, alternating current (AC) power may be supplied to the electrode assembly, the plurality of very-small LEDs may be simultaneously connected to the first electrode and the second electrode, and a plurality of subpixels may be formed.

In the subpixel, the number of the plurality of very-small LEDs included in a 100×100 μm² area may range from 2 to 100,000.

The plurality of very-small LEDs may include at least one very-small LED formed to emit light in a blue, green, red, and amber wavelength bands.

A length of the very-small LED may range from 100 nm to 10 μm, and an insulating film including an active layer of an outer circumferential surface of the very-small LED may be formed.

The plurality of very-small LEDs connected to the first electrode and the second electrode may be disposed to be parallel to a substrate of the LED module.

The common electrode may include an indium tin oxide (ITO) film.

The display including the very-small LED may further include an inverter configured to convert a direct current into AC and supply the AC to the first signal line, wherein the AC may be selectively supplied to the first electrode on the basis of the signal of the first signal line and the signal of the second signal line.

The first signal line connected to the LED module may include two or more lines.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
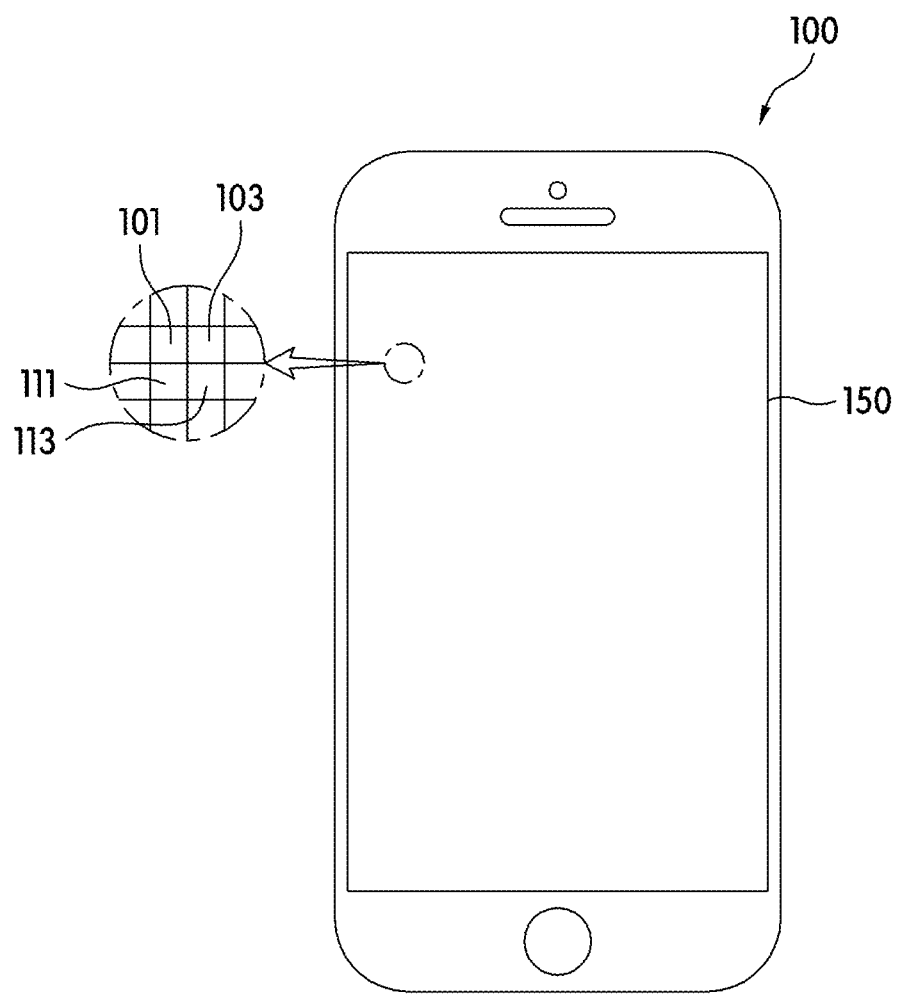
FIG. 1 is a view illustrating a display and a configuration of pixels in an electronic device according to one embodiment of the present invention.

Hereinafter, various embodiments of the invention that are easily performed by those skilled in the art will be described in detail with reference to the accompanying drawings. The present invention may be embodied in many different forms, specific embodiments are illustrated in the drawings, and detailed descriptions thereof may be disclosed. It should be understood, however, that there is no intent to limit the invention to the particular forms disclosed; rather the invention is to cover all modifications, equivalents, and alternatives falling within the spirit and scope of the invention. Parts irrelevant to the description may be omitted in the drawings in order to clearly explain the present invention, and like reference numerals in the drawings may be used for like elements.

In various embodiments of the present invention, expressions such as 'or,' 'at least one,' etc. may denote one of the elements that are listed together, or a combination of two or more of the elements. For example, 'A or B' and 'at least one of A and B' may include only one of A and B or both A and B.

In various embodiments of the present invention, expressions such as 'first,' 'second,' etc. may refer to various components but do not limit the order or importance of the corresponding components. For example, a first device and a second device are both devices and may represent different devices. Also, when elements such as a configuration, function, and operation of a first device are the same or similar to those of a second device, the first device could be deemed the second device, and, similarly, the second device could be deemed the first device, without departing from the scope of various embodiments of the present invention.

In various embodiments of the present invention, it should be understood that when an element is referred to as being "connected" or "coupled" to another element, it can be directly connected or coupled to the other element or intervening elements may be present. In contrast, it should be understood that when an element is referred to as being "directly connected" or "directly coupled" to another element, there are no intervening elements present.

The terminology used herein to describe various embodiments of the present invention is not intended to limit the invention. For example, the singular forms "a" and "an," as used herein, are intended to include the plural forms as well unless the context clearly indicates otherwise.

It should be clear that devices (or electronic devices) according to various embodiments of the present invention may be replaced by other devices in the same or similar form unless limitations are set clearly forth. Also, electronic devices according to various embodiments of the present invention may be configured with one or more combinations of the various devices described. For example, a device may be provided to have a structure including at least a portion of the devices described, or at least a portion of functions of the device. According to one embodiment, a device may include at least one display (display unit) or a device including at least one display.

Hereinafter, electronic devices according to various embodiments will be described with reference to the accompanying drawings. The term 'user' that is used in various embodiments may refer to a person that uses an electronic device or a device (e.g., an artificial intelligent electronic device) that uses an electronic device. In addition, the electronic device may be attached to or worn on a part of a body of the user, and the user in this state may be referred to as a user or a wearer. The electronic device may be referred to as a wearable electronic device (or a wearable device) when it is a device that is attached to or worn on a part of the body of the user. Also, an electronic device (e.g., a smart phone, a personal digital assistant (PDA), a smart watch, etc.) assigned to a user may be referred to as a user device.

FIG. 1 is a view illustrating a display and a configuration of pixels in an electronic device according to one embodiment of the present invention.

According to one embodiment, an electronic device 100 may include at least one display (or display unit) 150. Here, the display 150 may be defined as, for example, a display in which a light-emitting diode (LED) panel including LEDs is used as a backlight, and/or a display in which the LED panel is used as a display unit.

Referring to FIG. 1, a minimum unit of an image displayed on the display 150 of the electronic device 100 may be defined as a pixel (or a picture element). According to one embodiment, pixels may be defined in a matrix form (or a matrix structure) based on a space of a lattice form including row and columns in the display 150, but the present invention is not limited thereto, and the pixels may be defined in a matrix form based on one LED. Also, the pixels may be defined in a matrix form based on a plurality of LEDs constituting a designated pattern and/or an LED module in which a plurality of LEDs are disposed.

According to one embodiment, the display 150 may be divided into one or more lines in rows and columns. In this case, the lines formed in the row or the column may include electrode lines (e.g., word lines) or data lines (e.g., bit lines) through which a signal is input or output. In the following description, one line disposed in the row or the column constituting the display 150 may be represented as a first signal line, and the other line disposed therein may be represented as a second signal line.

According to various embodiments of the present invention, the lines disposed in the rows and columns of the display 150 are represented as the first signal line and the second signal line, but the present invention is not limited thereto, and the lines may be used in various ways, such as used as the data line described above. It should be clear that at least one of the first signal line and the second signal line may be separately disposed without being disposed in the rows and columns of the display 150 and the at least one of the signal lines may also be omitted.

According to one embodiment, the row (e.g., a first signal line 231) of the display 150 may be connected to an electrode. For example, referring to FIGS. 2A and 2B, word lines $WL_1$ to $WL_n$ may be lines which supply a specified basic signal (e.g., a frequency) or current to the LED module.

According to one embodiment, the column (e.g., a second signal line 233) of the display 150 may be a data line. For example, referring to FIGS. 2A and 2B, bit lines $BL_1$ to $BL_m$ may control signals which are input to or output from the LED module.

Figure 2A:
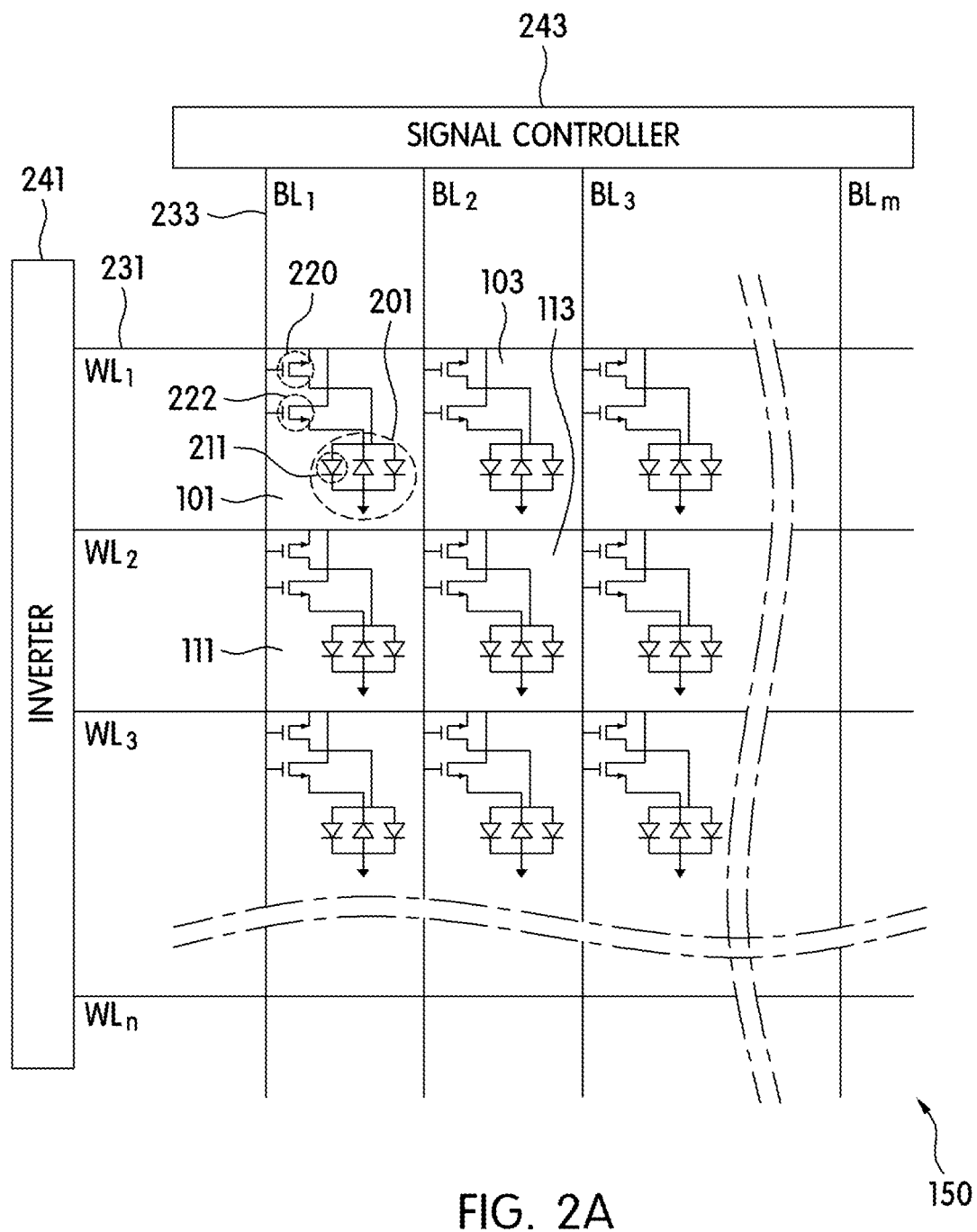
FIGS. 2A and 2B are views illustrating schematic configurations in which alternating current (AC) power is supplied to a light-emitting diode (LED) module including a plurality of LEDs in a display according to one embodiment of the present invention.
Figure 2B:
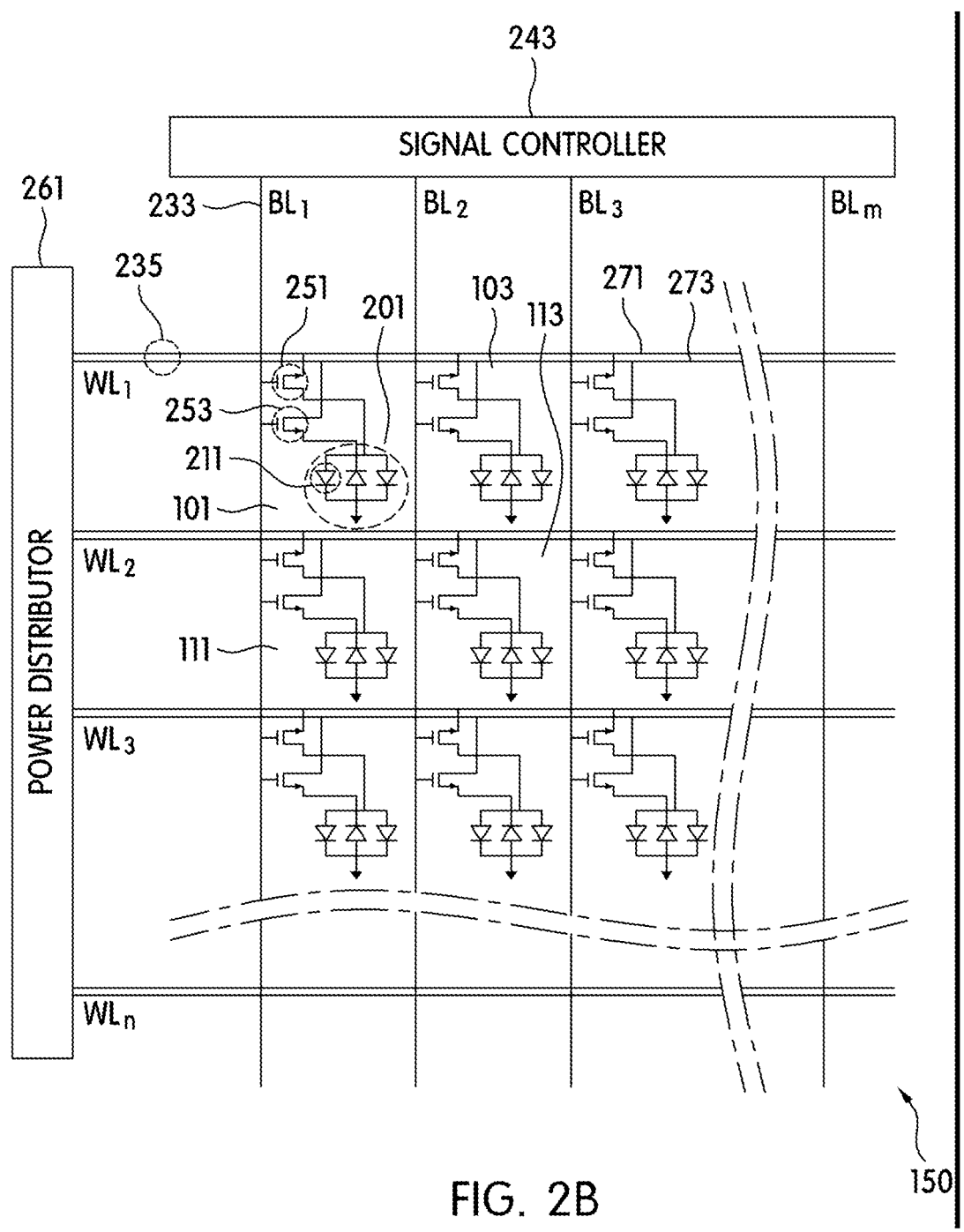

Referring to FIGS. 2A and 2B, the first signal line 231 is represented as a WL and is described as a line which supplies the specified basic signal (e.g., a frequency) or current to the LED module, and the second signal line 233 is represented as BL and is described as a line which controls the signal which is input to or output from the LED module, but the present invention is not limited to this description of one embodiment in which the signal lines disposed in the display 150 are used. It should be clear that each of the signal lines may be used in various ways and the name of the each of signal lines may also be used differently.

According to one embodiment, the pixels included in the display 150 may have a form in which one LED is included in a lattice based on one row and one column, but hereinafter, the display 150 in which two or more LEDs are included in one pixel may be described.

According to various embodiments, a ground of the LED included in the display 150 may be made of a transparent conductive film (e.g., an indium tin oxide (ITO) film) having electrical conductivity and may be used as a common electrode on a two-dimensional plane of the display 150.

FIGS. 2A and 2B are views illustrating schematic configurations in which alternating current (AC) power is supplied to an LED module including a plurality of LEDs in a display according to one embodiment of the present invention.

According to one embodiment, the display 150 of FIGS. 2A and 2B may be the display 150 in which pixels are configured based on the first signal line 231 and the second signal line 233. In the display 150, an LED module 201 including a plurality of LEDs may be connected to one pixel. For example, an LED 211 may be configured to be very small (e.g., nanoscale sized). According to one embodiment, a diameter of the LED 211 may range from 300 nm to 700 nm, and a length thereof may range from 2 μm to 3 μm. Therefore, the LED may be represented as a very-small LED.

The plurality of LEDs may include a color conversion layer at a designated region in which light in a blue wavelength band is converted into at least some light having green, red, and amber wavelengths (e.g., a front portion of an LED module which emits light of an element) to be emitted. In this case, the plurality of LEDs (or the LED module 201) may include at least one LED color conversion element in which the color conversion layer is formed so that at least some light having blue, green, red, and amber wavelengths is emitted.

According to one embodiment, the color conversion layer may be formed to include at least one phosphor (or fluorescent material) through which light in a designated frequency range passes. For example, when the LED is an ultraviolet (UV) LED, a phosphor excited by UV light may preferably be any one of blue, yellow, green, amber, and red phosphors, and in this case, may be formed as a single color LED lamp which emits one selected color.

Also, preferably, the phosphor excited by UV light may have at least one color of blue, yellow, green, amber, and red, and more preferably, may be represented as any one type of mixed blue and yellow phosphors, blue, green, and red phosphors, and blue, green, amber, and red phosphors. In this case, white light may be emitted by the formed phosphor.

According to various embodiments, a specific type of phosphor that may be combined according to colors emitted by the LED may vary and the combined phosphor may be a known combination, but the present invention is not limited thereto, and various embodiments are possible.

For example, when the LED is a very-small blue LED, a phosphor excited by blue light may preferably be at least one of yellow, green, amber, and red phosphors. More preferably, the phosphor excited by blue light may be a mixed phosphor of any one of blue and yellow phosphors, blue, green, and red phosphors, and blue, green, amber, and red phosphors, and in this case, white light may be emitted by the phosphor.

Preferably, a yellow phosphor may be at least one phosphor selected from a group consisting of $Y_3Al_5O_{12}$:Eu, $Lu_3Al_5O_{12}$:Eu, $(Sr,Ba)_3SiO_5$:Eu, $(Sr,Ba,Ca)_2SiO_4$:Eu, Ca-α-SiAlON:Eu, and $(Ba,Eu)ZrSi_3O_9$.

Preferably, a blue phosphor may be at least one phosphor selected from a group consisting of ZnS:AgCl, ZnS:AgAl, $(Sr,Ba,Ca,Mg)_{10}(PO_4)_6Cl_2$:Eu, $(Ba,Sr)MgAl_{10}O_{17}$:Eu, $BaMgAl_{10}O_{17}$:Eu, $(Sr,Ba)_3MgSi_2O_8$:Eu, $LaSi_3N_5$:Ce, $LaSi_5Al_2ON_9$:Eu, $Sr_2MgSi_2O_7$:Eu, and $CaMgSi_2O_6$:Eu.

Preferably, a green phosphor may be at least one phosphor selected from a group consisting of $SrGa_2S_4$:Eu, $(Sr,Ca)_3SiO_5$:Eu, $(Sr,Ba,Ca)SiO_4$:Eu, $Li_2SrSiO_4$:Eu, $Sr_3SiO_4$:Ce,Li, β-SiALON:Eu, $CaSc_2O_4$:Ce, $Ca_3Sc_2Si_3O_{12}$:Ce, Caα-SiALON:Yb, Caα-SiALON:Eu, Liα-SiALON:Eu, $Ta_3Al_5O_{12}$:Ce, $Sr_2Si_5N_8$:Ce, $(Ca,Sr,Ba)Si_2O_2N_2$:Eu, $Ba_3Si_6O_{12}N_2$:Eu, γ-AlON:Mn, and γ-AlON:Mn,Mg.

Preferably, an amber phosphor may be at least one phosphor selected from a group consisting of $(Sr,Ba,Ca)_2SiO_4$:Eu$(Sr,Ba,Ca)_3SiO_5$:Eu, and $(Ca,Sr,Ba)_2Si_5N_8$:Eu.

Preferably, a red phosphor may be at least one phosphor selected from a group consisting of $(Sr,Ca)AlSiN_3$:Eu, $CaAlSiN_3$:Eu, (Sr,Ca)S:Eu, $CaSiN_2$:Ce, $SrSiN_2$:Eu, $Ba_2Si_5N_8$:Eu, CaS:Eu, CaS:Eu,Ce, SrS:Eu, SrS:Eu,Ce, and $Sr_2Si_5N_8$:Eu.

According to various embodiments, the plurality of LEDs are not limited to light in a blue wavelength band, and may be implemented to include a color conversion layer through which blue, green, red, or amber light is emitted based on light in UV and near-UV wavelength bands. In this case, the plurality of LEDs (or the LED module 201) may include at least one LED color conversion element in which a phosphor, which is formed to emit at least one of light of blue, green, red, and amber wavelengths, is formed.

Here, the phosphor constituting the color conversion layer is not limited to the specific kind of the above-described phosphor for each color. Also, when the color conversion layer does not include a phosphor, an inside of the color conversion layer may be filled with at least one of a transparent silicon binder, an organic polymer, an inorganic polymer, and a glass material, but the present invention is not limited thereto.

In addition, according to various embodiments, the color conversion layer is not limited to the material including a phosphor or at least one of a transparent silicon binder, an organic polymer, an inorganic polymer, and a glass material as described above, and may be formed to include various optical components such as a polarizer (or a polarizing material).

According to one embodiment, when one pixel (e.g., 101, 103, 111, or 113) includes the LED module 201 in the display 150, each LED 211 constituting the LED module 201 may be defined. Referring to FIGS. 2A and 2B, the LED module 201 is illustrated to include three LEDs 211, but the present invention is not limited thereto, and it should be clear that the LED module 201 may include the LED module 201 including a various number of the LEDs 211.

According to various embodiments, it may be confirmed that a plurality of very-small LEDs included in one pixel are not arranged in a predetermined direction. For example, referring to the LED module 201, one very-small LED is connected to a ground and an electrode (e.g., the first signal line) in a direction opposite to the other two very-small LEDs (e.g., polarities of the LEDs are opposite). In this case, when an AC is provided to the LED module 201 in the display 150, all of the very-small LEDs included in the LED module 201 may operate based on a frequency of the AC and a signal frequency.

FIG. 2A is a view illustrating a schematic configuration in which an AC is supplied to a display using an inverter in the display according to one embodiment of the present invention.

According to one embodiment, in order to supply an AC to the display 150 to operate the LED module 201, an inverter 241 which converts a direct current (DC) into an AC may be connected to at least one electrode (e.g., the first signal line 231, WL) disposed on the display 150, and a signal controller 243, which generates a signal for driving the LED module 201 by being in communication with the AC provided through the first signal line, may be connected to at least one data line (e.g., the second signal line 233, BL) disposed on the display 150.

According to one embodiment, two or more switches (e.g., 220 and 222) may be connected between the first signal line 231 and the LED module 201. In this case, sources and drains of a first switch 220 and a second switch 222 connected to the first signal line 231 and the LED module 201 may be connected to be in opposite directions to each other.

According to one embodiment, the signal controller 243 may generate a selection signal (e.g., a binary signal, a dial pulse, a multi-frequency signal, etc.) based on a signal received from a processor (not illustrated) of the electronic device 100 and transmit the selection signal to each data line.

The current converted into the AC through the inverter 241 may be provided to the LED module 201 of the display 150 through the first signal line. In this case, the first switch 220 and the second switch 222 may selectively provide the AC to the LED module 201 on the basis of a frequency of the current received from the inverter 241 and the selection signal received from the signal controller 243.

FIG. 2B is a view illustrating a schematic configuration in which an AC is supplied to a display using a power distributor in the display according to one embodiment of the present invention.

According to one embodiment, in order to supply AC to the display 150 to operate the LED module 201, a power distributor 261 which distributes a current may be connected to at least one electrode (e.g., the first signal line 231, WL) disposed on the display 150, and the signal controller 243, which generates a signal for driving the LED module 201 by being in communication with the AC provided through the first signal line, may be connected to at least one data line (e.g., the second signal line 243, BL) disposed on the display 150.

Here, the power distributor 261 may include at least one inverter (e.g., the inverter 241 of FIG. 2A) which converts a DC into an AC.

According to one embodiment, in the display 150, the first signal line 231 may include two or more lines, for example, a negative signal line 271 for supplying a negative current (in this case, a voltage thereof is a positive voltage) to the LED module 201 and a positive signal line 273 for supplying a positive current (in this case, a voltage thereof is a negative voltage) to the LED module 201.

According to one embodiment, when power is supplied to the display 150, the power distributor 261 may separate the AC converted from the DC from the inverter 241 on the basis of a phase thereof, and selectively provide a current of a specified phase to the positive signal line 273 or the negative signal line 271.

According to various embodiments, when power is supplied to the display 150, the power distributor 261 is not limited to supplying a positive current to the positive signal line 273 and supplying a negative current to the negative signal line 271, and may divide a time point (or a pattern) at which the DC is supplied and supply the DC to the positive signal line 273 and/or the negative signal line 271 at the divided time points.

According to one embodiment, a source and a drain of a switch 251 which connects the negative signal line 271 to the LED module 201 and a source and a drain of a switch 253 which connects the positive signal line 273 to the LED module 201 may be connected to be in opposite directions to each other, and may selectively provide the AC transferred from the power distributor 261 to the LED module 201.

According to one embodiment, the signal controller 243 may generate the selection signal (e.g., the binary signal, the dial pulse, the multi-frequency signal, etc.) based on the signal received from the processor (not illustrated) of the electronic device 100 and transmit the selection signal to each data line.

According to one embodiment, referring to a first pixel 101 among pixels (e.g., 101, 103, 111, and 113) included in the display 150, each pixel may include at least one switch 220. However, the present invention is not limited thereto, and the display 150 may include two or more designated number of pixels including one switch.

Figure 3:
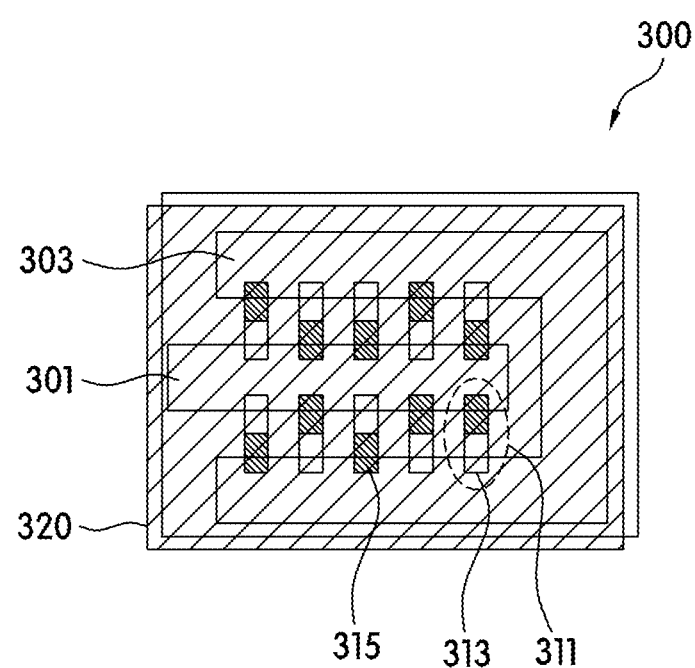
FIG. 3 is a view illustrating a configuration of an LED module in a display according to one embodiment of the present invention.

FIG. 3 is a view illustrating a configuration of an LED module in a display according to one embodiment of the present invention.

Referring to FIG. 3, an LED module 300 may include a plurality of LEDs 313 and 315. At least one of electrodes (e.g., a first electrode 301 and a second electrode 303) included in the LED module 300 may be connected to a power source which supplies power to the LEDs 313 and 315 and/or transmits a signal thereto. For example, when the first electrode 301 is connected to a first signal line 231 and/or a second signal line 233 through at least one switch, the second electrode 303 may be connected to a transparent conductive film 320 (e.g., an ITO film) which is formed as a common electrode of a display 150.

Similarly, when the first electrode 301 is connected to the transparent conductive film 320 (e.g., the ITO film) formed as the common electrode of the display 150, the second electrode 303 may be connected to the first signal line 231 and/or the second signal line 233 through at least one switch.

Here, the common electrode included in the display 150 is described as the ITO film, but the present invention is not limited thereto, and various materials such as a graphene film and a metal nanowire film may be used as the common electrode.

As described above, the first signal line 231 and the second signal line 233 included in the display 150 may be connected to the first electrode 301, the second electrode 303, and the LED module 300 including at least one of the very-small LEDs 313 and 315.

According to one embodiment, a subpixel may include the first electrode 301, the second electrode 303, and at least one of the plurality of very-small LEDs connected to at least one electrode in the LED module 300. Here, at least one subpixel 311 may be positioned by the first electrode 301 and the second electrode 303, upper and lower spaces of the first electrode 301 and the second electrode 303 may not be included therein, and the position may refer to a position at a space in which a plurality of very-small LEDs may be substantially located.

That is, one pixel (e.g., a unit pixel) may include a plurality of subpixels 311, and each of the subpixels may include one very-small LED 313 or 315 and/or two or more of the very-small LEDs 313 and 315.

According to one embodiment, the subpixel 311 may be formed in a space defined by the first electrode 301 and the second electrode 303 in the LED module 300, and may be formed to be directly on a surface of a substrate of the LED module 300 or indirectly on an upper portion of the substrate by being separated therefrom. Also, the subpixel 311 may be located on the same plane as or a different plane from at least one of the first electrode 301 and the second electrode 303.

According to one embodiment, areas of the subpixels may be the same or different. Preferably, in the subpixel 311, a unit area of the subpixel for being applied to a display, that is, an area of an arrangement region in which two electrodes that may be independently driven by the arrangement of the very-small LEDs 313 and 315 are disposed, may range from 50 $\mu m^2$ to 100,000 $\mu m^2$, and more preferably, may range from 100 $\mu m^2$ to 50,000 $\mu m^2$, but the unit area of the subpixel is not limited to the above-described area. Preferably, an area of the subpixel 311 may range from 50 $\mu m^2$ to 100,000 $\mu m^2$.

Since a unit electrode may be difficult to manufacture and a length of the very-small LED should be further reduced when the area of the subpixel 311 is less than 50 $\mu m^2$, there may also be a problem in manufacturing the very-small LED. Since the number of very-small LEDs included therein may be increased when the area of the subpixel 311 is more than 100,000 $\mu m^2$, there is a problem in that manufacturing costs may be increased and a distribution of the aligned very-small LEDs may not be uniform and there is a problem in that the number of pixels included in the area of the limited display device 150 may be reduced such that there is a problem in that a high-resolution display may not be implemented. According to one exemplary embodiment of the present invention, the total number of the subpixels 311 included in the LED module 300 of the display 150 may range from 2 to 10,000. However, the present invention is not limited thereto, and a size of the implemented LED module 300 may be changed according to an area and/or resolution of a display.

According to one embodiment, the number of very-small LEDs included in the LED module 300 per 100×100 μm² area thereof may range from 2 to 100,000. Furthermore the number of the very-small LEDs may preferably range from 10 to 10,000. When two very-small LEDs or less are included in the LED module 300, a ratio (%) of change in an optical characteristic due to defects of some of the very-small LEDs may not be minimized, it may be difficult for the very-small LEDs 313 and 315 in the LED module 300 to normally emit light, and there may be a problem in that a defect of the display 150 is caused. When the number of the very-small LEDs is more than 100,000, manufacturing costs may be increased and an arrangement of the very-small LEDs becomes a problem.

According to various embodiments of the present invention, a plurality of very-small LEDs are included in the LED module 300. Since one LED in a conventional LED display is attached at a unit pixel position, efficiency of the entire LED display may be lowered and the display itself may become defective when the attached LED is defective. Accordingly, in one exemplary embodiment of the present invention, a plurality of very-small LEDs are included in a unit pixel to address the above-described problem. According to one embodiment, when one very-small LED is used, one defect causes a 100% change in the optical characteristic, but a ratio (%) of change of the optical characteristic caused by one defect thereof may be reduced as the number of the very-small LEDs included in the unit pixel increases. Therefore, due to the plurality of very-small LEDs included in the LED module 300, a defect rate of the display 150 may be reduced. Accordingly, since other very-small LEDs are normal even when some of the plurality of very-small LEDs included in the unit pixel are defective, light may be normally emitted by the very-small LEDs 313 and 315 in each the subpixel 311 as a whole, the defect rate of the LED display may be minimized, and a light-emitting efficiency may be maximized.

In addition, according to one embodiment of the present invention, when the very-small LEDs connected to the first electrode 301 and the second electrode 303 of the LED module 300 are arranged, the very-small LEDs may be manufactured so that polarities are non-uniform.

Referring to FIG. 3, the first very-small LED 313 and the second very-small LED 315 of the LED module 300 may be connected to the first electrode 301 and the second electrode 303 in opposite directions to each other (e.g., polarities of the LEDs are opposite).

According to one embodiment, light may be emitted when a first pole of the first very-small LED 313 is connected to the first electrode 301 (in this case, a second pole of the first very-small LED 313 is connected to the second electrode 303) and a positive current is supplied thereto. Light may be emitted when a first pole of the second very-small LED 315 is connected to the second electrode 303 (in this case, a second pole of the second very-small LED 315 is connected to the first electrode 301) and a negative current is supplied thereto.

Generally, a display may output a graphic interface using a DC. In this case, when at least some of LEDs that are included in the display do not operate, a pixel of the display at a corresponding position may appear as a dead pixel or a stain may be generated, and thus a ratio (%) of change in an optical characteristic may be increased.

According to various embodiments of the present invention, when the plurality of very-small LEDs 313 and 315 included in the LED module 300 are arranged in opposite directions (e.g., polarities of at least some of the very-small LEDs are alternately arranged) as described above and the graphic interface is controlled to be output through the LED module 300 using an AC, a very-small LED connected to an electrode with a different polarity may operate even when some very-small LEDs included in the display 150 do not operate.

Therefore, since adjacent very-small LEDs of which polarities are connected in opposite directions are alternately operated based on an AC at a specified time point at which the AC is supplied to the LED module 300, dead pixels and/or stains may be prevented from being generated, and thus the ratio (%) of change in the optical characteristic may be minimized.

FIGS. 4A to 4I are views illustrating a process of manufacturing an LED module according to one embodiment of the present invention.

The process of manufacturing an LED module (e.g., the LED module 300 of FIG. 3) according to one embodiment of the present invention may include (1) a step of inputting a solution including a plurality of very-small LEDs to an electrode line for a very-small LED including a base substrate, a first electrode formed on the base substrate, and a second electrode formed to be spaced apart from the first electrode, (2) a step of supplying power to the electrode line in order to simultaneously connect the plurality of very-small LEDs to the first electrode and the second electrode, and (3) a step in which the plurality of very-small LEDs are self-aligned, and thus the very-small LED module 300 may be manufactured.

First, a method of manufacturing an electrode line for a very-small LED will be described. Specifically, FIGS. 4A to 4I are perspective views illustrating the process of manufacturing an electrode line formed on a base substrate according to one exemplary embodiment of the present invention. However, the process of manufacturing an electrode line for a very-small LED is not limited to a manufacturing process to be described below.

Figure 4:
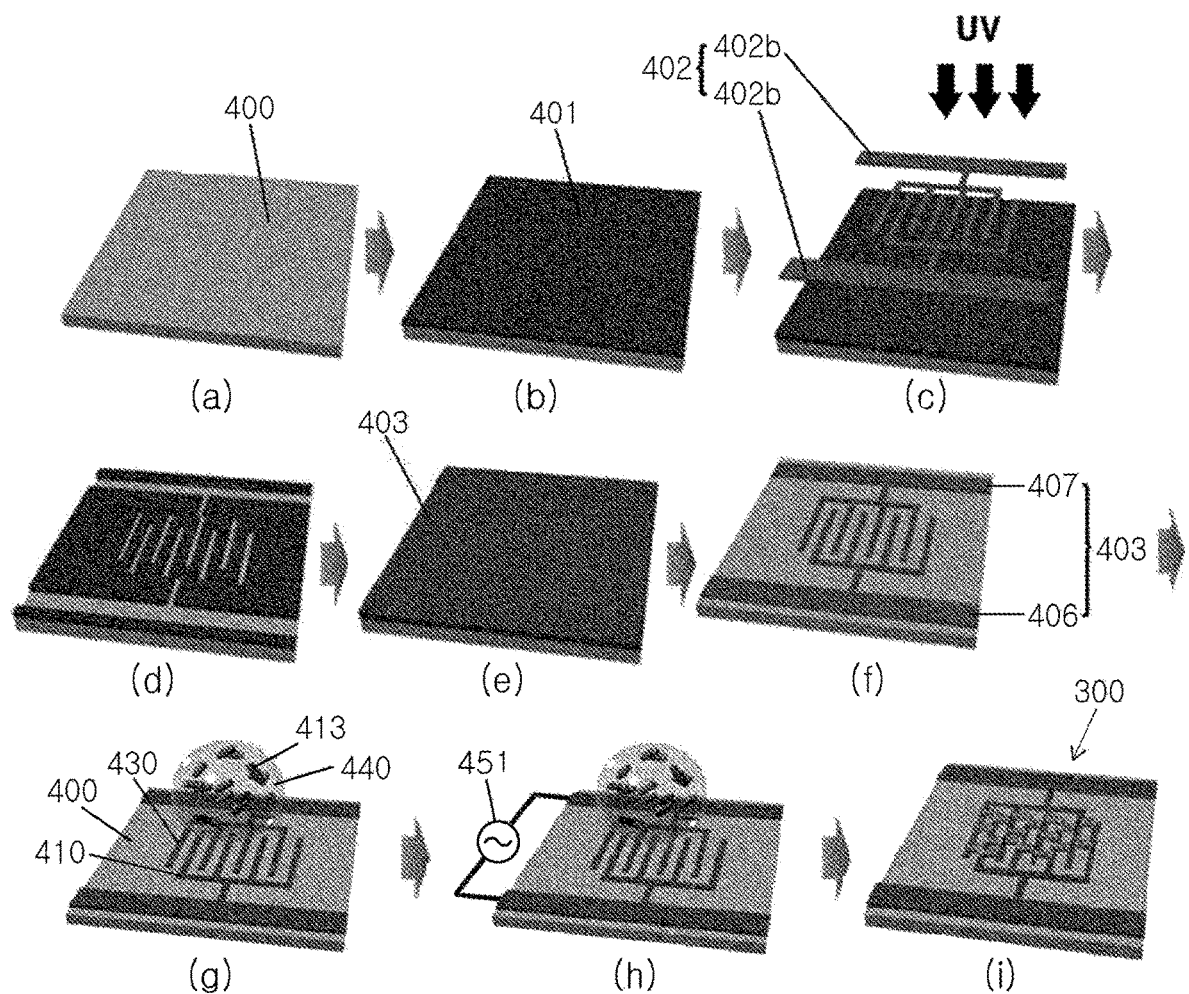
FIG. 4 is a view illustrating a process of manufacturing an LED module according to one embodiment of the present invention.

According to one embodiment, in FIG. 4A, any one of a glass substrate, a quartz substrate, a sapphire substrate, a plastic substrate, and a bendable (or flexible) polymer film may be preferably used as a base substrate 400 on which an electrode line is formed. Furthermore, the substrate may preferably be transparent. However, the present invention is not limited to the above-described types, and any type of base substrate on which a conventional electrode (or a common electrode) may be formed may be used.

An area of the base substrate 400 is not limited, and may be changed in consideration of an area of the first electrode and an area of the second electrode to be formed on the base substrate 400, sizes of very-small LEDs to be connected to the first electrode and the second electrode, and the number of the very-small LEDs to be connected. Preferably, a thickness of the base substrate may range from 100 μm to 1 mm, but the present invention is not limited thereto.

According to one embodiment, the base substrate 400 may be coated with a photoresist (PR) 401 as illustrated in FIG. 4B. The PR may be a PR commonly used in the art. Here, any one of spin coating, spray coating, and screen printing may be used as a method of coating the base substrate 400 with the PR according to one embodiment. Spin coating may be preferably used, but the present invention is not limited thereto, and a detailed method may be performed by a method known in the art. A thickness of the PR 401 with which the base substrate 400 is coated may range from 0.1 μm to 10 μm. However, the thickness of the PR 401 to be coated may be subsequently changed in consideration of a thickness of an electrode to be deposited on the base substrate.

After a layer of the PR 401 is formed on the base substrate 400 as described above, a mask 402 in which patterns 402*a* and 402*b* corresponding to an electrode line, in which a first electrode and a second electrode are alternately disposed on the same plane, are drawn may be placed on the layer of the PR 401 as illustrated in FIG. 4C, and an upper portion of the mask 402 may be exposed to UV rays.

A step of immersing an unexposed PR layer of the base substrate 400 in a conventional PR solvent and removing the unexposed PR layer may be performed so that the exposed portion of the PR layer in which the electrode line is to be formed may be removed as illustrated in FIG. 4D. According to one embodiment, a width of a pattern (e.g., 402*a*) corresponding to the first electrode line corresponding to the electrode line for a very-small LED may range from 100 nm to 50 μm, and a width of a pattern (e.g., 402*b*) corresponding to the second electrode line may range from 100 nm to 50 μm, but the present invention is not limited thereto.

According to one embodiment, an electrode forming material 403 may be deposited on a portion from which the PR layer is removed in a shape of the electrode line mask 402 as illustrated in FIG. 4E. An electrode forming material of the first electrode may include at least one metal material selected from a group consisting of aluminum, titanium, indium, gold, and silver or at least one transparent material selected from a group consisting of ITO, ZnO:Al, and a carbon nanotube (CNT)-conductive polymer complex. Here, when the electrode forming material includes two or more types of materials, the first electrode may preferably have a structure in which two or more types of materials are laminated. Furthermore, the first electrode may preferably include an electrode in which two types of materials such as titanium and gold are laminated. However, the first electrode is not limited to the above-described material.

An electrode forming material of the second electrode may include at least one metal material selected from a group consisting of aluminum, titanium, indium, gold, and silver or at least one transparent material selected from a group consisting of ITO, ZnO:Al, and a CNT-conductive polymer complex. When the electrode forming material includes two or more types of materials, the second electrode may preferably have a structure in which two or more types of materials are laminated. Furthermore, the second electrode may preferably include an electrode in which two types of materials such as titanium and gold are laminated. However, the second electrode is not limited to the above-described material.

The materials for forming the first electrode and the second electrode may be the same or different. The electrode forming material may be deposited by any one of a thermal deposition method, an e-beam deposition method, a sputtering deposition method, and a screen printing method. Preferably, the electrode forming material 403 may be deposited by a thermal deposition method, but the present invention is not limited thereto.

After the electrode forming material 403 is deposited, when the layer of the PR 401 with which the base substrate 400 is coated is removed using any one PR remover among acetone, 1-methyl-2-pyrrolidone (NMP), and dimethyl sulfoxide (DMSO) as illustrated in FIG. 4F, electrode lines 406 and 407 deposited on the base substrate 400 may be manufactured. Here, the electrode lines 406 and 407 deposited on the base substrate 400 may be formed as a pattern designated as a first electrode 410 and a second electrode 430. Also, the first electrode 410 and/or the second electrode 430 illustrated in FIGS. 4A to 4I may be formed to be the same as or similar to the first electrode 301 and the second electrode 303 illustrated in FIG. 3.

In the electrode lines 406 and 407 of the present invention manufactured by the above-described method, an area of a unit electrode, that is, an area of an arrangement region in which two electrodes may be independently driven by the arrangement of the very-small LEDs are disposed, may preferably range from 1 μm$^2$ to 100 cm$^2$, and more preferably, may range from 10 μm$^2$ to 100 mm$^2$ but the area of the unit electrode is not limited to the above-described area. Also, the electrode line may include one unit electrode or a plurality of unit electrodes.

Further, a distance between the first electrode 410 and the second electrode 430 in the electrode line may be less than or equal to a length of the very-small LED 413. Accordingly, the very-small LED 413 may be interposed between the first electrode 410 and the second electrode 430 in a form in which the very-small LED 413 is lying down to be connected between or across the electrodes.

Meanwhile, the electrode line that may be applied to the present invention may be applied to any display on which the very-small LED 413 may be mounted as the second electrode 430 formed to be spaced apart from the first electrode 410, and a specific arrangement of the first electrode 410 and the second electrode 430, which are spaced apart from each other on the same plane, may vary according to a purpose thereof.

According to one embodiment, FIG. 4G illustrates the first electrode 410 formed on the base substrate 400, the second electrode 430 formed to be spaced apart from the first electrode and on the same plane therewith, and a solution (here, a solvent 440) containing the plurality of very-small LEDs 413. An electrode region of the base substrate 400 in which the first electrode 410 and the second electrode 430 are formed may be coated with the solution including the very-small LEDs 413.

Next, according to one embodiment, in step (2), the very-small LEDs may be arranged to be non-uniform like the very-small LEDs 313 and 315 included in the LED module 300. Here, it is necessary to connect the very-small LEDs so that the number of very-small LEDs having opposite polarities is uniform within a specified rage (e.g., close to 1:1) even when the arrangement of the very-small LEDs included in the LED module 300 is non-uniform so as to minimize a ratio (%) of change in an optical characteristic of the display 150.

According to one embodiment, the plurality of very-small LEDs connected to the first electrode 410 and the second electrode 430 may have opposite polarities that is within the predetermined range (e.g., close to a 1:1 ratio) as illustrated in FIG. 4H, and a step of supplying AC power to the electrode line so that the plurality of very-small LEDs self-align may be performed to simultaneously connect the plurality of very-small LEDs.

According to the present invention, since the plurality of very-small LEDs 313 and 315 included in the very-small LED module may supply AC power to the first electrode 410 and the second electrode 430, the very-small LEDs 313 and 315 self-aligned may be rotated according to a change of polarities supplied to the first electrode 410 and the second electrode 430 and may be simultaneously connected to the first electrode 410 and the second electrode 430 as illustrated in FIG. 4I.

A general LED may be simultaneously connected to different electrodes that are formed directly on a substrate and disposed to be physically spaced apart from each other. For example, the general LEDs 313 and 315 may be manually laid out between the different electrodes of the planar electrode.

However, since it is difficult to directly physically dispose the very-small LEDs like in the present invention, a problem in which the very-small LEDs may not be simultaneously connected to different very-small electrodes spaced on the same plane may occur. Also, arranging at least some of the very-small LEDs 313 and 315 in different directions may lead to an increase in manufacturing costs of the LED module. Also, when the very-small LEDs 313 and 315 have a cylindrical shape, the very-small LEDs 313 and 315 do not self-align even when the very-small LEDs 313 and 315 are simply input to the electrode, and there is a problem in that the very-small LEDs 313 and 315 roll and move on the electrode due to the cylindrical shape.

Accordingly, in the present invention, the problem may be addressed by supplying AC power to the electrode line so that the very-small LEDs rotate and connect to the two electrodes by themselves.

According to one embodiment, the AC power may be a variable power having amplitude and a period, and a waveform thereof may be a pulse having a sinusoidal wave such as a sine wave or waveforms (or signals) other than a sinusoidal wave. For example, AC power converted from DC power may be supplied by the inverter 241, or the DC power may be repeatedly provided to the first electrode 410 at 0 V, 30 V, 0 V, 30 V, 0 V, and 30 V 1,000 times per second and to the second electrode 430 at 30 V, 0 V, 30 V, 0 V, 30 V, and 0 V in a manner opposite to the first electrode 410 so that a variable power having amplitude and a period may be made.

According to one embodiment, a voltage (amplitude) of the power may range from 0.1 V to 1,000 V and a frequency thereof may range from 10 Hz to 100 GHz. The self-aligned very-small LEDs 313 and 315, which are included in the solvent 440, are input to the electrode line. The solvent 440 may evaporate while the electrode is coated therewith, charges may be asymmetrically induced in the very-small LEDs 313 and 315 by induction of an electric field formed by a potential difference between the electrodes, and the very-small LEDs may self-align between the two different electrodes facing opposite ends of the very-small LEDs 313 and 315. According to one embodiment, the very-small LEDs 313 and 315 may be simultaneously connected to two different electrodes by power being supplied thereto for between 5 seconds to 120 seconds.

Meanwhile, the number (e.g., N) of the very-small LEDs 313 and 315 simultaneously connected to the first electrode 410 and the second electrode 430 in step (2) may be determined based on several parameters which are adjustable in step (2). Here, the parameters may include a voltage (or a potential difference, V) of the supplied power, a frequency (F, Hz) of the power, a concentration (C, a weight (%) of the very-small LEDs) of a solution including the very-small LEDs, a distance (Z) between two electrodes, and an aspect ratio (AR, where AR=H/D and D denotes a diameter of the very-small LED) of the very-small LED. Accordingly, the number (N) of the very-small LEDs 313 and 315 simultaneously connected to the first electrode 410 and the second electrode 430 may be proportional to the voltage (V), the frequency (F), the concentration (C) of the solution including the very-small LEDs, and the aspect ratio (AR) of the very-small LED and may be inversely proportional to the distance (Z) between the two electrodes.

According to one embodiment, since the very-small LEDs self-align between two different electrodes due to induction of an electric field formed by a potential difference between the electrodes, as an intensity of the electric field increases, the number of the very-small LEDs connected to the electrodes may increase. The intensity of the electric field may be proportional to the potential difference (V) of the electrodes and may be inversely proportional to the distance (Z) between the electrodes.

According to one embodiment, as the concentration (C, a weight (%) of the very-small LEDs) of the solution including the very-small LEDs increases, the number of the LEDs connected to the electrodes may increase.

According to one embodiment, since a charge difference formed in the very-small LEDs 313 and 315 is changed based on the frequency (F, Hz) of the power, as the frequency increases, the number of (e.g., N) of the very-small LEDs 313 and 315 connected to the electrodes may increase. Here, since charge induction may be lowered and/or may disappear when a magnitude of the frequency is more than or equal to a predetermined value, the number (e.g., N) of the very-small LEDs 313 and 315 connected to the electrodes may be reduced.

According to one embodiment, as the aspect ratio of the very-small LEDs increases, the induced electric charge due to the electric field may increase, and thus a large number of the very-small LEDs 313 and 315 may be aligned. Also, in consideration of an electrode line having a limited area in terms of space in which the very-small LEDs 313 and 315 may be aligned, since the diameter of the very-small LED is reduced in a state in which lengths of the very-small LEDs 313 and 315 are fixed, the number of the very-small LEDs which may be connected to the limited electrode line may increase as the aspect ratio thereof increases.

According to various embodiments of the present invention, there is an advantage in that the number of the LEDs connected to electrodes may be adjusted according to a purpose by adjusting the various above-described parameters.

Meanwhile, in step (2) according to the present invention, even when power is supplied to the electrode lines according to the aspect ratio of the very-small LEDs 313 and 315, it may be difficult for self-alignment of the very-small LEDs. According to one embodiment, the aspect ratio of the very-small LEDs 313 and 315 may range from 1.2 to 100, may more preferably range from 1.2 to 50, and may even more preferably range from 1.5 to 10. When the aspect ratio of the very-small LEDs 313 and 315 is less than 1.2, there is a problem in that the very-small LEDs 313 and 315 do not self-align when power is supplied to the electrode lines. Also, when the aspect ratio is more than 100, a voltage of power necessary for self-alignment may be lowered. However, it may be difficult to manufacture an LED having an aspect ratio of more than 100 due to a limitation in a process of manufacturing a very-small LED by performing dry etching or the like.

Preferably, in step (2), the number of the very-small LEDs 313 and 315 mounted in a 100×100 $\mu m^2$ area of the electrode lines 406 and 407 may range from 2 to 100,000, and may more preferably range from 10 to 10,000. Since the very-small LED module 300 includes the plurality of very-small LEDs 313 and 315, functional degradation or malfunction of the very-small LED module due to defects of some of the plurality of very-small LEDs 313 and 315 may be minimized. Also, when the very-small LED module 300 includes more than 100,000 very-small LEDs 313 and 315, manufacturing costs may increase and there may be a problem in aligning the very-small LEDs.

Meanwhile, the method of manufacturing the very-small LED module 300 according to one embodiment of the present invention may further include (3) a step of forming a metal ohmic layer on a connection portion of the first electrode 410, the second electrode 430, and the very-small LEDs 313 and 315 as a step which is performed after step (2) described above.

Since the metal ohmic layer is formed on the connection portion, light may be emitted by the very-small LEDs when power is supplied to two different electrodes connected to the plurality of very-small LEDs 313 and 315. In this case, since a large resistance may be generated between the electrodes and the very-small LEDs 313 and 315, the method may include the step of forming a metal ohmic layer to reduce the resistance.

According to one embodiment, the metal ohmic layer may be formed by the following processes, but is not necessarily formed only by the following processes, and any conventional method of forming a metal ohmic layer may be used without limitation.

First, an upper portion of the very-small LED module 300 on which step (2) is performed may be coated with a PR having a thickness of 2 μm to 3 μm. The coating may be preferably performed by any one of spin coating, spray coating, and screen printing, but the present invention is not limited thereto. Subsequently, UV rays may be irradiated toward the coated PR layer under the base substrate 400 of the very-small LED module 300, a portion of the PR layer except for the PR layer above the electrode may be cured, and the un-cured PR layer above the electrode may then be removed using a conventional PR solvent.

According to one embodiment, gold or silver may be vacuum-deposited or electrochemically deposited on an upper portion of the electrode from which the PR is removed and/or the upper portion of the electrode from which the PR is removed may be coated with gold nanocrystals or silver nanocrystals by performing electric spraying thereon, but the deposited material and the deposition method are not limited thereto. A thickness of the metal layer to be coated may preferably range from 5 nm to 100 nm, but the present invention is not limited thereto.

Then, the metal layer in a portion except for the electrode may be removed along with the PR using any one of PR strippers such as acetone, N-methyl-2-pyrrolidone (nmP) and dimethyl sulfoxide (DMSO), heat treatment may be performed at a temperature of 500° C. to 600° C. after the removal, and the metal ohmic layer may be formed between both ends of the very-small LEDs 313 and 315, which are not coated with an insulating film, and the electrodes.

Figure 5:
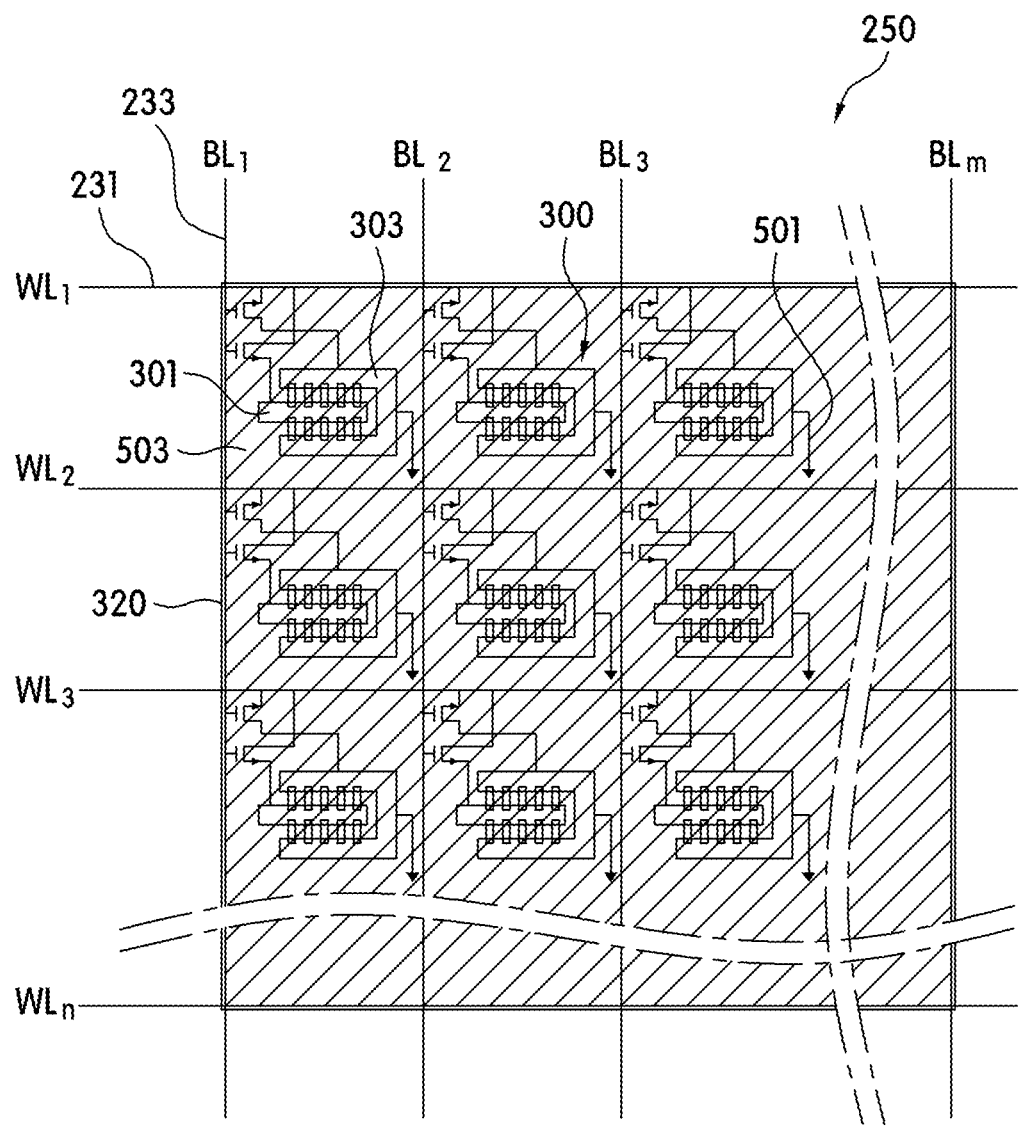
FIG. 5 is a view illustrating a configuration in which an LED module is disposed in a pixel of a display according to one embodiment of the present invention.

FIG. 5 is a view illustrating a configuration in which an LED module is disposed in a pixel of a display according to one embodiment of the present invention.

According to one embodiment, the pixels 101, 103, 111 and/or 113 included in the display 150 illustrated in FIG. 1 may include at least one LED module 300. Here, the LED module 300 may include a first electrode 301 and a second electrode 303, and at least one of the electrodes may be connected to at least one of a first signal line 231, a second signal line 233, and a ground 501 which are included in the display 150. For example, the first electrode 301 of the LED module 300 may be connected to at least one of the first signal line 231 and the second signal line 233 which are included in the display 150, and the second electrode 303 may be connected to the ground 501 included in the display 150. Here, the ground 501 connected to the second electrode 303 of the LED module 300 may be formed as a common electrode which connects two or more grounds included in LED modules included in a plurality of pixels.

According to one embodiment, when the display 150 included in the electronic device 100 is formed as a touch screen, a ground of the touch screen may be formed on one layer of the display 150. In this case, the ground of the touch screen may be formed as a transparent electrode in one layer of the display 150 using a transparent conductive film 503 made of ITO. Here, a common electrode, in which the second electrode 303 of the LED module 300 is formed as the transparent conductive film 503 on the one layer of the display 150, may be the same as or similar to the transparent conductive film 320 connected to at least one electrode of the LED module 300 of FIG. 3. According to one embodiment, the one layer of the display 150 may refer to one of a plurality of layers formed on one surface of the display 150.

According to one embodiment of the present invention, the display including the very-small LED module may include a panel in which a first signal line and a second signal line are disposed in a lattice form, a first electrode connected to the first signal line and the second signal line, two or more switches which connect the first signal line and the second signal line to the first electrode, a second electrode connected to a ground, an electrode assembly including the first electrode and the second electrode, and an LED module in which a plurality of very-small LEDs are connected to the first electrode and the second electrode, wherein the second electrode may be connected to a common electrode formed as one layer of the panel, at least one other LED module may be grounded to the common electrode, and the two or more switches may selectively provide a current supplied through the first signal line to the first electrode on the basis of a signal of the first signal line and a signal of the second signal line.

According to various embodiments, at least some polarities of the plurality of very-small LEDs included in the LED module may be connected to the first electrode and the second electrode to be in opposite directions.

According to various embodiments, in the LED module, a solution including the plurality of very-small LEDs may be introduced into the electrode assembly, AC power may be supplied to the electrode assembly, and the plurality of very-small LEDs may be simultaneously connected to the first electrode and the second electrode so that a plurality of subpixels may be formed.

According to various embodiments, the number of the plurality of very-small LEDs included in the subpixel in a 100×100 μm$^2$ area may range from 2 to 100,000.

According to various embodiments, the plurality of very-small LEDs may include at least one very-small LED formed to emit light in blue, green, red, and amber wavelength bands.

According to various embodiments, a length of the very-small LED may range from 100 nm to 10 μm, and an insulating film including an active layer formed on an outer circumferential surface of the LED may be formed.

According to various embodiments, the plurality of very-small LEDs connected to the first electrode and the second electrode may be disposed to be parallel to the substrate of the LED module.

According to various embodiments, the common electrode may be formed by an ITO film.

According to various embodiments, the display including the very-small LED module may further include an inverter which converts a DC into an AC and supplies the AC to the first signal line, and the AC may be selectively provided to the first electrode on the basis of the signal of the first signal line and the signal of the second signal line.

According to various embodiments, the first signal line connected to the LED module may include two or more lines.

According to the present invention, in a display including a very-small LED and a method of manufacturing the same, it is possible to overcome a difficulty in coupling a conventional very-small LED to an electrode to be three-dimensionally erect by connecting a very-small nanoscale LED to two other very-small electrodes without a short-circuit, while simultaneously overcoming a difficulty in coupling a very-small LED in a one-to-one correspondence with another very-small electrode, and thus a display including an LED module including a plurality of very-small LEDs can be implemented.

Also, in a conventional LED display, since a subpixel is formed on an electrode and photons generated in an active layer of a very-small LED are blocked by the electrode and are not extracted but are absorbed inside the LED, the conventional LED display has a low light extraction efficiency. However, according to the present invention, since a position of a subpixel is changed, and moreover, the number of photons emitted from an active layer to the atmosphere increases due to a cylindrical shape of a very-small LED connected to an electrode and relative positioning thereof with the electrode and the substrate, that is, due to an arrangement of the very-small LED on the substrate, a light extraction efficiency of the very-small LED can be significantly improved.

Furthermore, in order to prevent the generation of defective pixels and defects of the entire display due to defects of the very-small LED which may occur, defects of the display including the very-small LED can be minimized by including the plurality of very-small LEDs in the subpixel, and original functions thereof can be maintained.

Furthermore, since the very-small LEDs are not coupled to upper and lower electrodes to be three-dimensionally erect like in the conventional LED display and the very-small LEDs are easily self-aligned between the two different electrodes, a large-area LED display in which the very-small LEDs are arranged in a large-area plane to be in a drivable state can be mass-produced.

Also, since the display in which at least some polarities of the LED module are alternately arranged operates based on an AC, efficiency of power used in an electronic device can be effectively controlled.

While the present invention has been particularly described with reference to exemplary embodiments, it should be understood by those skilled in the art that various changes in form and details may be made without departing from the spirit and scope of the present invention. For example, each component specifically shown in the embodiments of the present invention can be modified and embodied. It should be understood that the present invention may be embodied in many other specific forms without departing from the spirit or essential characteristics thereof.

What is claimed is:

1. A display comprising:
a panel on which a first signal line and a second signal line are disposed;
a first electrode connected to the first signal line and the second signal line;
a second electrode connected to a ground;
a plurality of light emitting diodes (LEDs) connected to at least one of the first electrode and the second electrode,
wherein the first electrode and the second electrode are disposed on a substrate and are spaced apart from each other on the substrate, and
the plurality of LEDs are disposed to be parallel to the substrate, and at least some of the plurality of LEDs are connected in parallel between the first electrode and the second electrode to be in opposite directions; and
two or more switches which connect the first electrode to the first signal line and the second signal line,
wherein source and drain electrodes of one of the two or more switches and source and drain electrodes of another of the two or more switches are connected to be in opposite directions to each other.

2. The display of claim 1, wherein a solution including the plurality of LEDs is applied to the first electrode and the second electrode, alternating current (AC) power is supplied to the first electrode and the second electrode, the plurality of LEDs are simultaneously connected to the first electrode and the second electrode, and a plurality of subpixels are formed.

3. The display of claim 2, wherein, in the subpixels, the number of the plurality of LEDs included in a 100×100 μm$^2$ area ranges from 2 to 100,000.

4. The display of claim 1, wherein the plurality of LEDs include at least one LED formed to emit light in a blue, green, red, and amber wavelength bands.

5. The display of claim 1, wherein the plurality of LEDs include at least one LED color conversion element in which a color conversion layer, through which light having some wavelengths among green, red, and amber wavelengths converted from light in a blue wavelength band is emitted, is formed.

6. The display of claim 1, wherein the plurality of LEDs includes at least one LED color conversion element in which a color conversion layer, through which light having some wavelengths among blue, green, red, and amber wavelengths converted from light in ultraviolet and near-ultraviolet wavelength bands is emitted, is formed.

7. The display of claim 1, wherein the plurality of LEDs includes an LED in which a length of the LED ranges from 100 nm to 10 μm, and an insulating film disposed on at least an outer circumferential surface of an active layer of the LED is formed.

8. The display of claim 1, wherein the second electrode is connected to a common electrode formed on the panel; and wherein
the two or more switches selectively provide a current supplied through the first signal line to the first electrode on the basis of a signal of the first signal line and a signal of the second signal line.

9. The display of claim 8, wherein the common electrode includes a graphene film.

10. The display of claim 8, wherein the common electrode includes a metal nanowire film.

11. The display of claim 1, further comprising an inverter configured to convert a direct current (DC) into an AC and supply the AC to the first signal line,
wherein the AC is selectively supplied to the first electrode on the basis of a signal of the first signal line and a signal of the second signal line.

12. The display of claim 1, wherein the first signal line connected to the first electrode includes two or more lines.

13. The display of claim 1, wherein a distance between the first electrode and the second electrode in a length direction of the plurality of LEDs is less than the length of the plurality of LEDs.

14. The display of claim 13, wherein the plurality of LEDs includes an LED in which at least one end of the LED is disposed on the first electrode or the second electrode.

15. The display of claim 1, wherein the second electrode faces at least two sides of the first electrode.

16. The display of claim 8, wherein the common electrode includes an indium tin oxide (ITO) film.

17. The display of claim 1, wherein the two or more switches comprise a first switch coupled to a first polarity terminal of at least one of the plurality of LEDs, and a second switch coupled to a second polarity terminal of at least one other of the plurality of LEDs.

* * * * *